US010186629B2

(12) United States Patent
Forrest et al.

(10) Patent No.: US 10,186,629 B2
(45) Date of Patent: Jan. 22, 2019

(54) THIN FILM LIFT-OFF VIA COMBINATION OF EPITAXIAL LIFT-OFF AND SPALLING

(71) Applicant: The Regents of the University of Michigan, Ann Arbor, MI (US)

(72) Inventors: Stephen R. Forrest, Ann Arbor, MI (US); Kyusang Lee, Ann Arbor, MI (US); Jeramy D. Zimmerman, Golden, CO (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 14/910,010

(22) PCT Filed: Aug. 26, 2014

(86) PCT No.: PCT/US2014/052642
§ 371 (c)(1),
(2) Date: Feb. 4, 2016

(87) PCT Pub. No.: WO2015/073089
PCT Pub. Date: May 21, 2015

(65) Prior Publication Data
US 2016/0197227 A1  Jul. 7, 2016

Related U.S. Application Data

(60) Provisional application No. 61/870,062, filed on Aug. 26, 2013.

(51) Int. Cl.
*H01L 31/18* (2006.01)
*H01L 21/18* (2006.01)

(52) U.S. Cl.
CPC ........ *H01L 31/1896* (2013.01); *H01L 21/187* (2013.01); *H01L 31/1892* (2013.01); *Y02E 10/50* (2013.01)

(58) Field of Classification Search
None
See application file for complete search history.

(56) References Cited

U.S. PATENT DOCUMENTS 7,445,977 B2 * 11/2008 Chu ................... H01L 21/76254
257/E21.129
2011/0186910 A1   8/2011 Forrest et al.
(Continued)

OTHER PUBLICATIONS

International Search Report dated May 8, 2015, PCT/US2014/052642.

*Primary Examiner* — Shamim Ahmed
(74) *Attorney, Agent, or Firm* — Finnegan, Henderson, Farabow, Garrett & Dunner, LLP

(57) ABSTRACT

The present disclosure generally relates to thin film liftoff processes for use in making devices such as electronic and optoelectronic devices, e.g., photovoltaic devices. The methods described herein use a combination of epitaxial liftoff and spalling techniques to quickly and precisely control the separation of an epilayer from a growth substrate. Provided herein are growth structures having a sacrificial layer positioned between a growth substrate and a sacrificial layer. Exemplary methods of the present disclosure include forming at least one notch in the sacrificial layer and spalling the growth structure by crack propagation at the at least one notch to separate the epilayer from the growth substrate.

45 Claims, 2 Drawing Sheets

(56) References Cited

U.S. PATENT DOCUMENTS

Figure 1:
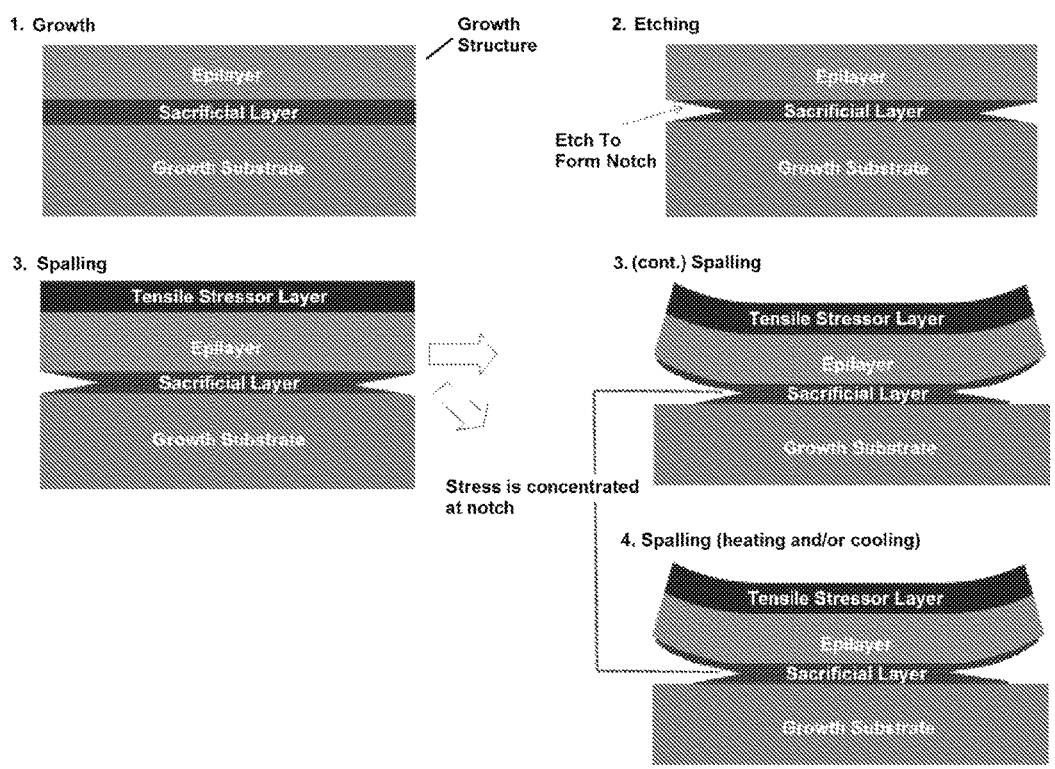

2012/0322191 A1* 12/2012 Lee .................... H01L 33/0079
                                                                    438/47
2013/0005119 A1    1/2013  Bedell et al.
2013/0071999 A1    3/2013  Cheng et al.
2016/0336233 A1* 11/2016  Yonehara ............ H01L 21/7813

* cited by examiner

THIN FILM LIFT-OFF VIA COMBINATION OF EPITAXIAL LIFT-OFF AND SPALLING

CROSS-REFERENCE TO RELATED APPLICATIONS

This application claims the benefit of priority to U.S. Provisional Application No. 61/870,062, filed Aug. 26, 2013, which is incorporated herein by reference in its entirety.

STATEMENT REGARDING FEDERALLY SPONSORED RESEARCH

This invention was made with U.S. Government support under Contract No. ARL-MAST W911 NF-08-1-0004 awarded by the U.S. Army Research Laboratory. The government has certain rights in the invention.

JOINT RESEARCH AGREEMENT

The subject matter of the present disclosure was made by, on behalf of, and/or in connection with one or more of the following parties to a joint university-corporation research agreement: The Regents of the University of Michigan and Nanoflex Power Corporation. The agreement was in effect on and before the date the subject matter of the present disclosure was prepared, and was made as result of activities undertaken within the scope of the agreement.

The present disclosure generally relates to thin film liftoff processes using a combination of epitaxial liftoff and spalling. These processes can be used to make electronic and optoelectronic devices, such as photovoltaic devices.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. PV devices, which may generate electrical energy from light sources other than sunlight, can be used to drive power consuming loads to provide, for example, lighting, heating, or to power electronic circuitry or devices such as calculators, radios, computers or remote monitoring or communications equipment. These power generation applications also often involve the charging of batteries or other energy storage devices so that operation may continue when direct illumination from the sun or other light sources is not available, or to balance the power output of the PV device with a specific application's requirements. As used herein the term "resistive load" refers to any power consuming or storing circuit, device, equipment or system.

Another type of photosensitive optoelectronic device is a photoconductor cell. In this function, signal detection circuitry monitors the resistance of the device to detect changes due to the absorption of light.

Another type of photosensitive optoelectronic device is a photodetector. In operation, a photodetector is used in conjunction with a current detecting circuit which measures the current generated when the photodetector is exposed to electromagnetic radiation and may have an applied bias voltage. A detecting circuit as described herein is capable of providing a bias voltage to a photodetector and measuring the electronic response of the photodetector to electromagnetic radiation.

These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias. As a general rule, a photovoltaic cell provides power to a circuit, device or equipment, but does not provide a signal or current to control detection circuitry, or the output of information from the detection circuitry. In contrast, a photodetector or photoconductor provides a signal or current to control detection circuitry, or the output of information from the detection circuitry but does not provide power to the circuitry, device or equipment.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices may be optimized for maximum electrical power generation under standard illumination conditions (i.e., Standard Test Conditions which are 1000 W/m², AM1.5 spectral illumination), for the maximum product of photocurrent times photovoltage. The power conversion efficiency of such a cell under standard illumination conditions depends on the following three parameters: (1) the current under zero bias, i.e., the short-circuit current $I_{SC}$, in Amperes (2) the photovoltage under open circuit conditions, i.e., the open circuit voltage $V_{OC}$, in Volts and (3) the fill factor, FF.

PV devices produce a photo-generated current when they are connected across a load and are irradiated by light. When irradiated under infinite load, a PV device generates its maximum possible voltage, V open-circuit, or $V_{OC}$. When irradiated with its electrical contacts shorted, a PV device generates its maximum possible current, I short-circuit, or $I_{SC}$. When actually used to generate power, a PV device is connected to a finite resistive load and the power output is given by the product of the current and voltage, I×V. The maximum total power generated by a PV device is inherently incapable of exceeding the product, $I_{SC} \times V_{OC}$. When the load value is optimized for maximum power extraction, the current and voltage have the values, $I_{max}$ and $V_{max}$, respectively.

A figure of merit for PV devices is the fill factor, FF, defined as:

$$FF = \{I_{max} V_{max}\} / \{I_{SC} V_{OC}\} \qquad (1)$$

where FF is always less than 1, as $I_{SC}$ and $V_{OC}$ are never obtained simultaneously in actual use. Nonetheless, as FF approaches 1, the device has less series or internal resistance and thus delivers a greater percentage of the product of $I_{SC}$ and $V_{OC}$ to the load under optimal conditions. Where $P_{inc}$ is the power incident on a device, the power efficiency of the device, $\eta_P$, may be calculated by:

$$\eta_P = FF*(I_{SC}*V_{OC})/P_{inc}$$

To produce internally generated electric fields that occupy a substantial volume of the semiconductor, the usual method is to juxtapose two layers of material with appropriately selected conductive properties, especially with respect to their distribution of molecular quantum energy states. The interface of these two materials is called a photovoltaic junction. In traditional semiconductor theory, materials for forming PV junctions can be fabricated so that they are either n- or p-type. Here n-type denotes that the majority carrier type is the electron. This could be viewed as the material having many electrons in relatively free energy states. Here p-type denotes that the majority carrier type is the hole. Such material has many holes in relatively free energy states. The type of the background, i.e., not photogenerated, majority carrier concentration depends primarily on doping by defects or impurities, either intentional or unintentional. The type and concentration of impurities determine the value of the Fermi energy, or level, within the gap between the conduction band minimum and valance band maximum energies. The Fermi energy characterizes the statistical occupation of molecular quantum energy states denoted by the value of energy for which the probability of occupation is equal to ½. A Fermi energy near the conduction band minimum energy indicates that electrons are the predominant carrier. A Fermi energy near the valence band maximum energy indicates that holes are the predominant carrier. Accordingly, the Fermi energy is a primary characterizing property of traditional semiconductors and the prototypical PV structure has traditionally been the p-n junction.

The term "rectifying" denotes, inter alia, that an interface has an asymmetric conduction characteristic, i.e., the interface supports electronic charge transport preferably in one direction. Rectification is associated normally with a built-in electric field which occurs at the junction between appropriately selected materials.

Conventional inorganic semiconductor PV cells employ a p-n junction to establish an internal field. High-efficiency PV devices are typically produced on expensive, single crystal growth substrates. These growth substrates may include single crystal wafers, which can be used for creating a perfect lattice and structural support for the epitaxial growth of epilayers, such as active layers. These epilayers may be integrated into PV devices with their original growth substrates intact. Alternatively, those epilayers may be removed and recombined with a host substrate.

In some instances, it may be desirable to transfer the epilayers to host substrates that exhibit desirable optical, mechanical, or thermal properties. For example, Gallium Arsenide (GaAs) epilayers may be grown on Silicon (Si) substrates. However, the electronic quality of the resulting material may be insufficient for certain electronic applications. Therefore, it may be desirable to preserve the high material quality of the lattice-matched epilayers, while allowing the integration of those epilayers with other substrates. This may be accomplished by a method known as epitaxial liftoff. In epitaxial liftoff processes, epilayers may be "lifted off" growth substrates and recombined (e.g., bonded or adhered) to a new host substrate.

Although they may provide desirable epitaxial growth characteristics, typical growth substrates can be thick and create excess weight, and the resulting devices tend to be fragile and require bulky support systems. Epitaxial liftoff is a desirable way to transfer epilayers from their growth substrates to more efficient, light-weight, and flexible host substrates.

In particular, epitaxial liftoff enables the separation of an epilayer from a growth substrate by selectively etching a sacrificial layer. The liftoff interface can be precisely controlled at the sacrificial layer. Epitaxial liftoff, however, can be a slow process, typically taking several hours or even several days to complete. Thus, there is a need to introduce new thin film liftoff methods that are fast and precisely controlled.

The present disclosure addresses this need by combining epitaxial liftoff with spalling. Spalling is a fast liftoff process that uses crack propagation assisted by a stressed layer. The stressed layer induces a stress in a substrate, and the induced stress guides a crack in a direction parallel to the interface between the substrate and a thin film layer. Spalling alone, however, suffers from disadvantages such as the inability to precisely control the cracking interface. For example, deviation at the cracking position during spalling can be on the order of a micron. The inventive methods of the present disclosure combine epitaxial liftoff and spalling techniques for fast and precisely controlled thin film liftoff processes, whereby crack propagation is controlled at the sacrificial layer, resulting in a controlled cracking interface.

As disclosed herein, a method for separating an epilayer from a growth substrate comprises providing a growth structure comprising a growth substrate, a sacrificial layer, and an epilayer, wherein the sacrificial layer is disposed between the growth substrate and the epilayer, etching at least one notch in the sacrificial layer, and spalling the growth structure by crack propagation at the at least one notch to separate the epilayer from the growth substrate.

Also disclosed is a method for separating an epilayer from a growth substrate comprising depositing a sacrificial layer over a growth substrate and depositing an epilayer over the sacrificial layer, wherein the growth substrate, the sacrificial layer, and the epilayer are at least part of a growth structure, etching at least one notch in the sacrificial layer, and spalling the growth structure by crack propagation at the at least one notch to separate the epilayer from the growth substrate.

Further disclosed is a method for separating an epilayer from a growth substrate comprising, providing a growth structure comprising a growth substrate, a sacrificial layer, and an epilayer, wherein the sacrificial layer is disposed between the growth substrate and the epilayer, depositing a tensile stressor layer over the epilayer, and etching at least one notch into the sacrificial layer.

In addition, there is disclosed a method for separating an epilayer from a growth substrate comprising, providing a growth structure comprising a growth substrate, a sacrificial layer, an epilayer, and one or more strained layers, wherein the sacrificial layer and the one or more strained layers are disposed between the growth substrate and the epilayer, and spalling the growth structure by crack propagation at the sacrificial layer to separate the epilayer from the growth substrate.

The accompanying figures are incorporated in, and constitute a part of this specification.

FIG. 1 shows an exemplary process of separating an epilayer from a growth substrate according to the present disclosure.

Figure 2A:
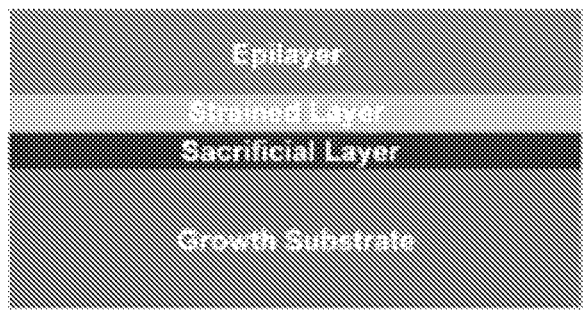
Figure 2B:
Figure 2C:
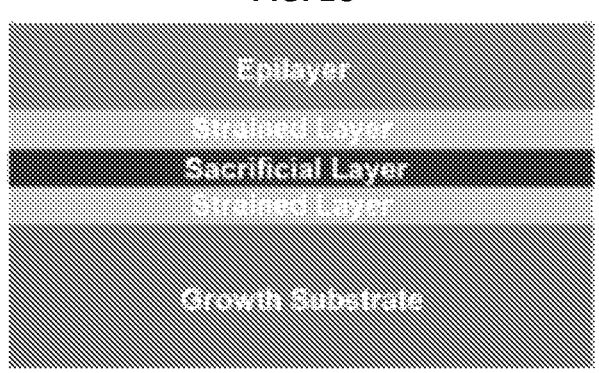

FIGS. 2A, 2B, and 2C show schematics of growth structures including one or more strained layers according to the present disclosure.

As used herein, the term "III-V material," may be used to refer to compound crystals containing elements from group IIIA and group VA of the periodic table. More specifically, the term "III-V material" may be used herein to refer to compounds which are combinations of the group of Gallium (Ga), Indium (In) and Aluminum (Al), and the group of Arsenic (As), Phosphorous (P), Nitrogen (N), and Antimony (Sb).

It should be noted that the III-V compounds herein are named in an abbreviated format. A two component material is considered to be in approximately a 1:1 molar ratio of group III:V compounds. In a three or more component system (e.g. InGaAlAsP), the sum of the group III species (i.e. In, Ga, and Al) is approximately 1 and the sum of the group V components (i.e. As, and P) is approximately 1, and thus the ratio of group III to group V is approximately unity.

Names of III-V compounds are assumed to be in the stoichiometric ratio needed to achieve lattice matching or lattice mismatching (strain), as inferred from the surrounding text. Additionally, names can be transposed to some degree. For example, AlGaAs and GaAlAs are the same material.

As used herein, the term "layer" refers to a member or component of a photosensitive device whose primary dimension is X-Y, i.e., along its length and width, and is typically perpendicular to the plane of incidence of the illumination. It should be understood that the term "layer" is not necessarily limited to single layers or sheets of materials. A layer can comprise laminates or combinations of several sheets of materials. In addition, it should be understood that the surfaces of certain layers, including the interface(s) of such layers with other material(s) or layers(s), may be imperfect, wherein said surfaces represent an interpenetrating, entangled or convoluted network with other material(s) or layer(s). Similarly, it should also be understood that a layer may be discontinuous, such that the continuity of said layer along the X-Y dimension may be disturbed or otherwise interrupted by other layer(s) or material(s).

When a first layer is described as disposed or deposited "over" or "above" a second layer, the first layer is positioned further away from the substrate of the structure. There may be other layers between the first layer and the second layer, unless it is specified that the first layer is disposed or deposited "on" or "in physical contact with" the second layer. For example, a sacrificial layer may be described as disposed "over" or "above" a growth substrate, even though there may be various layers in between. Similarly, when a first layer is described as disposed or deposited "between" a second layer and a third layer, there may be other layers between the first layer and the second layer, and/or the first layer and the third layer, unless it is specified that the first layer is disposed or deposited "on" or "in physical contact with" the second and/or third layers.

As used herein, a "tensile stressor layer" is a layer that is tensile stressed or can become tensile stressed.

As used herein, "tensile stress" or "tensile strain" means that a material or layer is under tension parallel to the substrate.

As used herein, "compressive strain" means that a material or layer is under compression parallel to the substrate.

As used herein, the term "spalling" means to cleave into smaller pieces. For example, "spalling the growth structure" as described herein results in the separation of the epilayer from the growth substrate.

In one aspect of the present disclosure, a method for separating an epilayer from a growth substrate comprises providing a growth structure comprising a growth substrate, a sacrificial layer, and an epilayer, wherein the sacrificial layer is disposed between the growth substrate and the epilayer, etching at least one notch in the sacrificial layer, and spalling the growth structure by crack propagation at the at least one notch to separate the epilayer from the growth substrate.

FIG. 1 illustrates an example of a method for separating an epilayer from a growth substrate according to the present disclosure. In step 1, a growth structure having a growth substrate, a sacrificial layer, and an epilayer is provided. The growth substrate may comprise any number of materials, including single crystal wafer materials. In some embodiments, the growth substrate is a single crystal wafer. In some embodiments, the growth substrate may comprise a material chosen from Germanium (Ge), Si, GaAs, InP, GaP, GaN, GaSb, AlN, SiC, CdTe, sapphire, and combinations thereof. In some embodiments, the growth substrate comprises GaAs. In some embodiments, the growth substrate comprises InP. In some embodiments, the materials comprising the growth substrate may be doped. Suitable dopants may include, but are not limited to, Zinc (Zn), Mg (and other group IIA compounds), Zn, Cd, Hg, C, Si, Ge, Sn, O, S, Se, Te, Fe, and Cr. For example, the growth substrate may comprise InP doped with Zn and/or S. Unless otherwise indicated, it should be understood that reference to a layer comprising, e.g., InP encompasses InP in its undoped and doped (e.g., p-InP, n-InP) forms. Suitable dopant selections may depend, for example, on the semi-insulating nature of a substrate, or any defects present therein.

The epilayer of the growth structure refers to any active layer or collection of active layers. The epilayer may include, for example, any active material that may be desirable for use in a photosensitive device, such as a photovoltaic device. Thus, in some embodiments, the epilayer may be considered a "device region." In some embodiments, the epilayer comprises at least one III-V material.

The sacrificial layer of the growth structure acts as a release layer through a combination of ELO and spalling techniques. The sacrificial layer may be lattice matched or mismatched to the epilayer. The sacrificial layer may be chosen to have a high etch selectivity relative to the epilayer and/or the growth substrate such that at least one notch can be etched in the sacrificial layer while minimizing or eliminating etching of the epilayer and/or growth substrate. In some embodiments, the sacrificial layer comprises a III-V material. In some embodiments, the III-V material is chosen from AlAs, AlInP, and AlGaInP. In certain embodiments, the sacrificial layer comprises AlAs. In some embodiments, the sacrificial layer has a thickness in a range from about 2 nm to about 200 nm, such as from about 4 nm to about 100 nm, from about 4 nm to about 80 nm, or from about 4 nm to about 25 nm.

The growth structure may further comprise one or more strained layers disposed between the growth substrate and the epilayer. In some embodiments, the one or more strained layers are disposed between the growth substrate and the sacrificial layer. In some embodiments, the one or more strained layers are disposed between the sacrificial layer and the epilayer. Non-limiting, exemplary embodiments that include one or more strained layers are shown in FIG. 2. FIG. 2A shows a growth structure comprising a strained layer disposed between the sacrificial layer and the epilayer. In FIG. 2B, a strained layer is disposed between the growth substrate and the sacrificial layer. And in FIG. 2C, a first strained layer is disposed between the growth substrate and the sacrificial layer, and a second strained layer disposed between the sacrificial layer and the epilayer. The one or more strained layers may be lattice mismatched to the sacrificial layer. In some embodiments, the one or more strained layers are in physical contact with the sacrificial layer.

In some embodiments, the one or more strained layers are independently tensile or compressive strained. In certain embodiments, the one or more strained layers are compressive strained. In other embodiments, the one or more strained layers are tensile strained.

In some embodiments, where the growth structure comprises a strained layer disposed between the sacrificial layer and the epilayer, such as in FIG. 2A, the strained layer is tensile strained. In some embodiments, where the growth structure comprises a strained layer disposed between the growth substrate and the sacrificial layer, such as in FIG. 2B, the strained layer is compressive strained. In some embodiments, where a first strained layer is disposed between the growth substrate and the sacrificial layer, and a second strained layer disposed between the sacrificial layer and the epilayer, such as in FIG. 2C, the first strained layer is compressive strained and the second strained layer is tensile strained.

In some embodiments, the one or more strained layers may independently comprise one or more III-V materials. Suitable III-V materials include, but are not limited to, InP, InGaAs, AlInP, GaInP, InAs, InSb, GaP, AlP, GaSb, AlSb, and GaAs.

The growth structure may further comprise one or more buffer layers, or one or more protective layers. Protective layers may be disposed between the growth substrate and the sacrificial layer and/or the sacrificial layer and the epilayer. These layers serve to protect the growth substrate and/or the epilayer during the epitaxial lift off and spalling techniques, allowing for continuous reuse of the growth substrate. U.S. Pat. No. 8,378,385 and U.S. Patent Publication No. 2013/0043214 are incorporated herein by reference for their disclosure of buffer and protective layer schemes.

Suitable deposition methods for preparing the growth structure include, but are not limited to, gas source molecular beam epitaxy, MOCVD (metallo-organic chemical vapor deposition), MOVPE (metallo-organic vapor phase epitaxy), HVPE (hydride vapor phase Epitaxy), solid source MBE, and chemical beam epitaxy.

As shown in step 2 of FIG. 1, at least one notch is formed in the sacrificial layer. The at least one notch shown in step 2 is exemplary only. In accordance with the present disclosure, the at least one notch is capable of concentrating tensile stress induced in the growth structure for separating the epilayer from the growth substrate. The at least one notch may be formed by etching the sacrificial layer. In some embodiments, the sacrificial layer is wet etched with an etchant to form the at least one notch. One non-limiting technique is to dip or submerge the growth structure in the etchant. In some embodiments, the sacrificial layer is vapor etched with an etchant to form the at least one notch.

The etchant may be chosen to selectively etch the sacrificial layer. For example, the etching selectivity of the sacrificial layer to the epilayer and/or the growth substrate may be at least about $10^2$:1, such as at least about $10^3$:1, $10^4$:1, $10^5$:1, $10^6$:1, or $10^7$:1. In some embodiments, the etchant comprises HF. It should be noted that, in accordance with the present disclosure, the sacrificial layer is not etched in its entirety to effect the release of the epilayer from the growth substrate. Rather the sacrificial layer is only partially etched to form at least one notch.

In step 3 of FIG. 1, the growth structure is spalled by crack propagation at the at least one notch to separate the epilayer from the growth substrate. Spalling may be performed according to techniques known in the art. In some embodiments, as shown in the figure, the spalling step comprises depositing a tensile stressor layer over the epilayer. In some embodiments, the tensile stressor layer is in physical contact with the epilayer. In some embodiments, an additional layer or layers are positioned between the epilayer and the tensile stressor layer. For example, the tensile stressor layer may be deposited over and/or on a handle over the epilayer. In some embodiments, the tensile stressor layer comprises a material chosen from metals and polymers. Suitable metals include, but are not limited to, Ni, Ir, Cr, Fe, W, and alloys thereof, such as NiFe. Other metals may be used. Polytetrafluoroethylene, polyimide, and other polymers with coefficients of thermal expansion (CTE) mismatched with the underlying layer(s) are examples of polymers that may be used as the tensile stressor layer. The tensile stressor layer may be deposited according to techniques known in the art for depositing such materials, e.g., dip coating, spin-coating, sputtering, chemical vapor deposition, physical vapor deposition, plating, etc. "Depositing" a tensile stressor layer also includes other techniques of securing the stressor layer to the growth structure, such as adhering (e.g., if a tensile stress-inducing polymeric tape is used).

The tensile stressor layer may be tensile stressed upon deposition, inducing a stress in the growth structure. Suitable deposition techniques include, but are not limited to, physical vapor deposition by sputtering and electroplating. The degree of tensile stress may be controlled according to techniques known in the art, such as by controlling processing parameters. For example, the degree of stress can be controlled by controlling the pressure during sputtering, or by controlling the applied current during electroplating. In some embodiments, the degree of stress may range from about 100 MPa to about 10 GPa. In some embodiments, the tensile stressor layer has a thickness in a range from about 0.1 μm to about 50 μm.

Due to the etching step, the stress is concentrated at the at least one notch in the sacrificial layer. If great enough in the context of the growth structure system at hand, the stress will initiate spalling of the growth structure by crack propagation at the at least one notch, separating the epilayer from the growth substrate, as shown in step 3 (cont.).

The at least one notch in the sacrificial layer helps to control the spalling interface by concentrating the stress at the at least one notch. The degree of stress in the tensile stressor layer and the thickness of the stressor layer can be optimized to also control the spalling interface at the sacrificial layer. For example, the thickness of the epilayer can influence the desired degree of stress in the tensile stressor layer. These techniques are used to minimize liftoff times and create a smooth liftoff interface.

In some embodiments, additional processing is performed to increase the tensile stress of the tensile stressor layer to initiate or facilitate spalling. For example, as shown in optional step 4 in FIG. 1, in some embodiments, the spalling step further comprises heating the tensile stressor layer, cooling the tensile stressor layer, or a combination thereof. In some of these embodiments, the tensile stressor layer is selected to have a different coefficient of thermal expansion (CTE) (greater) from the CTE(s) of the underlying layer(s) (smaller) such that a temperature change will tensile stress the stressor layer. One non-limiting technique for inducing a temperature change is annealing the growth structure and the tensile stressor layer (the tensile stressor layer is attached to the growth structure). The annealing may be followed by cooling to induce tensile stress. Another non-limiting technique for inducing a temperature change is cooling the growth structure and the tensile stressor layer, e.g., by immersing the growth structure and the tensile stressor layer in liquid nitrogen or placing the growth structure and the tensile stressor layer onto the surface of dry ice.

In some embodiments, the spalling step further comprises disposing a handle over the tensile stressor layer and using the handle to initiate or facilitate the crack propagation. In embodiments where the tensile stressor layer is sufficiently thick, the tensile stressor layer may be used as a handle to initiate or facilitate the crack propagation.

In some embodiments, the tensile stressor layer is not tensile stressed upon its deposition and requires additional processing to induce tensile stress and initiate spalling. Tensile stress may be induced according to the techniques discussed above. For example, the spalling step may further comprise heating the tensile stressor layer, cooling the tensile stressor layer, or a combination thereof. As also discussed above, the tensile stressor layer may be selected to have a different coefficient of thermal expansion (CTE) from the CTE(s) of the underlying layer(s) such that a temperature change will tensile stress the stressor layer.

In embodiments where the growth substrate comprises one or more strained layers, as described herein, the one or more strained layers can expedite and control the spalling process. For example, the one or more strained layers may induce a strain on the sacrificial layer to mechanically weaken the sacrificial layer, which can expedite and control crack propagation at the least one notch of the sacrificial layer. The one or more strained layers may also act as one or more protective layers to protect the growth substrate and/or the epilayer during the etching and spalling steps.

If the sacrificial layer of the growth structure is mechanically weak, the methods of the present disclosure may not include the etching step. The mechanically weak sacrificial layer serves to control and guide the spalling at the sacrificial layer. The sacrificial layer may be strained or the growth structure may comprise one or more strained layers, as described herein, to induce strain on the sacrificial layer. In some embodiments, the sacrificial layer is lattice mismatched to the epilayer. In some embodiments, the one or more strained layers are lattice mismatched to the sacrificial layer.

The present disclosure also includes a method for separating an epilayer from a growth substrate comprising depositing a sacrificial layer over a growth substrate and depositing an epilayer over the sacrificial layer, wherein the growth substrate, the sacrificial layer, and the epilayer are at least part of a growth structure, etching at least one notch in the sacrificial layer, and spalling the growth structure by crack propagation at the at least one notch to separate the epilayer from the growth substrate.

The sacrificial layer and the epilayer can be deposited over the growth substrate using, for example, the deposition techniques described above for preparing the growth structure.

Additional layers, such as, for example, buffer layers and/or protective layers may also be deposited as part of the growth structure.

The etching and spalling steps may be carried out as described above and as shown in FIG. 1.

In some embodiments, the method further comprises depositing one or more strained layers, as described above, between the growth substrate and the epilayer. In some embodiments, the step of depositing one or more strained layers comprises depositing a strained layer over the sacrificial layer prior to depositing the epilayer. In some embodiments, the step of depositing one or more strained layers comprises depositing a strained layer over the growth substrate prior to depositing the sacrificial layer. In some embodiments, the step of depositing one or more strained layers comprises depositing a first strained layer over the growth substrate prior to depositing the sacrificial layer, and depositing a second strained layer over the sacrificial layer prior to depositing the epilayer.

In a further aspect of the present disclosure, a method for separating an epilayer from a growth substrate comprises providing a growth structure comprising a growth substrate, a sacrificial layer, and an epilayer, wherein the sacrificial layer is disposed between the growth substrate and the epilayer, depositing a tensile stressor layer, as described above, over the epilayer, and etching at least one notch in the sacrificial layer, as described above. This aspect of the present disclosure is similar to the method shown in FIG. 1, except that the tensile stressor layer is deposited before etching at least one notch in the sacrificial layer.

To provide the growth structure, the sacrificial layer and the epilayer can be deposited over the growth substrate using, for example, the deposition techniques described above. The growth structure may also include additional layers as described above.

As described above, the tensile stressor layer may or may not be tensile stressed upon its deposition. Tensile stress or additional tensile stress may be induced in the tensile stressor layer according to techniques described above and as known in the art. In some embodiments, the tensile stressor layer is sufficiently tensile stressed such that upon performing the etching step, the growth structure is spalled by crack propagation at the least one notch to separate the epilayer from the growth substrate.

In some embodiments, the method further comprises spalling the growth structure by crack propagation at the at least one notch to separate the epilayer from the growth substrate according to any of the techniques described above for inducing stress in the tensile stressor layer. For example, the spalling step may comprise disposing a handle over the tensile stressor layer and using the handle to initiate the crack propagation. The spalling step may comprise heating the tensile stressor layer, cooling the tensile stressor layer, or a combination thereof, as described above, particularly for embodiments using mismatched CTEs.

The growth structure may further comprise one or more strained layers as described above.

It should be understood that embodiments described herein may be used in connection with a wide variety of structures. Additional layers not specifically described may also be included. Materials other than those specifically described may be used. The names given to the various layers herein are not intended to be strictly limiting.

Unless otherwise indicated, all numbers expressing quantities of ingredients, reaction conditions, analytical measurements and so forth, used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

What is claimed is:

1. A method for separating an epilayer from a growth substrate comprising:
   providing a growth structure comprising a growth substrate, a sacrificial layer, an epilayer, and one or more strained layers, wherein the sacrificial layer and the one or more strained layers are disposed between the growth substrate and the epilayer, and wherein the one or more strained layers induce a strain on the sacrificial layer to mechanically weaken the sacrificial layer;
   etching at least one notch in the sacrificial layer; and
   spalling the growth structure by crack propagation at the at least one notch to separate the epilayer from the growth substrate.

2. The method of claim 1, wherein the etching step is performed by wet etching.

3. The method of claim 1, wherein the spalling step comprises depositing a tensile stressor layer over the epilayer.

4. The method of claim 3, wherein the tensile stressor layer comprises a material chosen from metals and polymers.

5. The method of claim 4, wherein the material is a metal chosen from Ni, Ir, Cr, Fe, W, and alloys thereof.

6. The method of claim 3, wherein the tensile stressor layer is tensile stressed upon deposition.

7. The method of claim 6, wherein the spalling step further comprises disposing a handle over the tensile stressor layer and using the handle to initiate the crack propagation.

8. The method of claim 6, wherein the spalling step further comprises heating the tensile stressor layer, cooling the tensile stressor layer, or a combination thereof.

9. The method of claim 3, wherein the spalling step further comprises heating the tensile stressor layer, cooling the tensile stressor layer, or a combination thereof.

10. The method of claim 1, wherein the one or more strained layers independently exhibit compressive strain or tensile strain.

11. The method of claim 1, wherein the one or more strained layers independently comprise one or more III-V materials.

12. The method of claim 11, wherein the one or more strained layers are lattice mismatched to the sacrificial layer.

13. The method of claim 11, wherein the III-V materials are chosen from InP, InGaAs, AlInP, GaInP, InAs, InSb, GaP, AlP, GaSb, AlSb, and GaAs.

14. The method of claim 1, wherein the one or more strained layers comprise a first strained layer disposed between the growth substrate and the sacrificial layer, and a second strained layer disposed between the sacrificial layer and the epilayer.

15. The method of claim 1, wherein the growth substrate comprises a single crystal wafer material.

16. The method of claim 1, wherein the growth substrate comprises a material chosen from Ge, Si, GaAs, InP, GaP, GaN, GaSb, AlN, SiC, CdTe, sapphire, and combinations thereof.

17. The method of claim 1, wherein the sacrificial layer comprises AlAs.

18. A method for separating an epilayer from a growth substrate comprising:
    depositing a sacrificial layer over a growth substrate, depositing an epilayer over the sacrificial layer, and depositing one or more strained layers between the growth substrate and the epilayer, wherein the growth substrate, the sacrificial layer, the epilayer, and the one or more strained layers are at least part of a growth structure, and wherein the one or more strained layers induce a strain on the sacrificial layer to mechanically weaken the sacrificial layer;
    etching at least one notch in the sacrificial layer; and
    spalling the growth structure by crack propagation at the at least one notch to separate the epilayer from the growth substrate.

19. The method of claim 18, wherein the etching step is performed by wet etching.

20. The method of claim 18, wherein the spalling step comprises depositing a tensile stressor layer over the epilayer.

21. The method of claim 20, wherein the spalling step further comprises heating the tensile stressor layer, cooling the tensile stressor layer, or a combination thereof.

22. A method for separating an epilayer from a growth substrate comprising:
    providing a growth structure comprising a growth substrate, a sacrificial layer, an epilayer, and one or more strained layers, wherein the sacrificial layer and the one or more strained layers are disposed between the growth substrate and the epilayer, and wherein the one or more strained layers induce a strain on the sacrificial layer to mechanically weaken the sacrificial layer;
    depositing a tensile stressor layer over the epilayer; and
    etching at least one notch into the sacrificial layer.

23. The method of claim 22, wherein the etching step is performed by wet etching.

24. The method of claim 22, wherein the tensile stressor layer comprises a material chosen from metals and polymers.

25. The method of claim 24, wherein the material is a metal chosen from Ni, Ir, Cr, Fe, W, and alloys thereof.

26. The method of claim 22, wherein the tensile stressor layer is sufficiently tensile stressed such that upon performing the etching step, the growth structure is spalled by crack propagation at the at least one notch to separate the epilayer from the growth substrate.

27. The method of claim 22, further comprising spalling the growth structure by crack propagation at the at least one notch to separate the epilayer from the growth substrate.

28. The method of claim 27, wherein the spalling step comprises disposing a handle over the tensile stressor layer and using the handle to initiate the crack propagation.

29. The method of claim 27, wherein the spalling step comprises heating the tensile stressor layer, cooling the tensile stressor layer, or a combination thereof.

30. The method of claim 22, wherein the one or more strained layers independently comprise one or more III-V materials.

31. The method of claim 22, wherein the one or more strained layers are lattice mismatched to the sacrificial layer.

32. A method for separating an epilayer from a growth substrate comprising:
    providing a growth structure comprising a growth substrate, a sacrificial layer, an epilayer, and one or more strained layers, wherein the sacrificial layer and the one or more strained layers are disposed between the growth substrate and the epilayer, and wherein the one or more strained layers induce a strain on the sacrificial layer to mechanically weaken the sacrificial layer; and
    spalling the growth structure by crack propagation at the sacrificial layer to separate the epilayer from the growth substrate.

33. The method of claim 32, wherein the one or more strained layers are disposed between the growth substrate and the sacrificial layer.

34. The method of claim 32, wherein the one or more strained layers are disposed between the sacrificial layer and the epilayer.

35. The method of claim 32, wherein the one or more strained layers independently exhibit compressive strain or tensile strain.

36. The method of claim 32, wherein the one or more strained layers independently comprise one or more III-V materials.

37. The method of claim 36, wherein the one or more strained layers are lattice mismatched to the sacrificial layer.

38. The method of claim 36, wherein the III-V materials are chosen from InP, InGaAs, AlInP, GaInP, InAs, InSb, GaP, AlP, GaSb, AlSb, and GaAs.

39. The method of claim 32, wherein the one or more strained layers comprise a first strained layer disposed between the growth substrate and the sacrificial layer, and a second strained layer disposed between the sacrificial layer and the epilayer.

40. The method of claim 39, wherein the first strained layer is compressive strained and the second strained layer is tensile strained.

41. The method of claim 32, wherein the spalling step comprises depositing a tensile stressor layer over the epilayer.

42. The method of claim 41, wherein the tensile stressor layer comprises a material chosen from metals and polymers.

43. The method of claim 42, wherein the material is a metal chosen from Ni, Ir, Cr, Fe, W, and alloys thereof.

44. The method of claim 41, wherein the spalling step further comprises disposing a handle over the tensile stressor layer and using the handle to initiate the crack propagation.

45. The method of claim 41, wherein the spalling step further comprises heating the tensile stressor layer, cooling the tensile stressor layer, or a combination thereof.

* * * * *